United States Patent
Yoshida

(10) Patent No.: US 9,802,341 B2
(45) Date of Patent: Oct. 31, 2017

(54) DRIVING APPARATUS, LITHOGRAPHY APPARATUS, AND METHOD OF MANUFACTURING AN ARTICLE

(71) Applicant: CANON KABUSHIKI KAISHA, Tokyo (JP)

(72) Inventor: Koji Yoshida, Utsonomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 39 days.

(21) Appl. No.: 14/685,684

(22) Filed: Apr. 14, 2015

(65) Prior Publication Data
US 2015/0293459 A1    Oct. 15, 2015

(30) Foreign Application Priority Data

Apr. 15, 2014    (JP) .................................. 2014-083454

(51) Int. Cl.
*H02P 8/32*    (2006.01)
*B29C 43/58*    (2006.01)
(Continued)

(52) U.S. Cl.
CPC .......... *B29C 43/58* (2013.01); *G03F 7/70725* (2013.01); *G05B 19/404* (2013.01);
(Continued)

(58) Field of Classification Search
CPC .............. G03F 7/70725; G05B 19/404; G05B 2219/50218; G05B 2219/45028
See application file for complete search history.

(56) References Cited

U.S. PATENT DOCUMENTS 5,568,032 A * 10/1996 Wakui ................... B23Q 15/22
                                                                310/311
7,072,777 B1    7/2006 Wakui et al.
(Continued)

FOREIGN PATENT DOCUMENTS

JP    2003284388 A    10/2003
JP    4272750 B2    6/2009

OTHER PUBLICATIONS

Office Action issued in Korean Appln. No. 10-2015-0048898 dated Apr. 20, 2017. English translation provided.

*Primary Examiner* — Shawki S Ismail
*Assistant Examiner* — Muhammad S Islam
(74) *Attorney, Agent, or Firm* — Rossi, Kimms & McDowell LLP

(57) ABSTRACT

A driving apparatus is disclosed which has a movable part, a measuring device measuring a position of the movable part, two actuators respectively generating two thrusts which have a common axis of action thereof with respect to the movable part, and a controller that controls the position by the two actuators based on output of the measuring device. The controller obtains information of at least one of a thrust constant of one of the two actuators, a thrust constant of the other of the actuators, and rigidity of a member which supports the movable part with respect to the axis of action, based on a relationship between disturbance force estimated from thrust commands for the two actuators and an output of the measuring device in a case where the one actuator generates a thrust and the other actuator controls the position, and a thrust command for the one actuator.

12 Claims, 4 Drawing Sheets

(51) Int. Cl.
*H01J 37/317* (2006.01)
*H01J 37/20* (2006.01)
*G05B 19/404* (2006.01)
*G03F 7/20* (2006.01)

(52) U.S. Cl.
CPC .......... *H01J 37/20* (2013.01); *H01J 37/3174* (2013.01); *B29C 2043/5833* (2013.01); *G05B 2219/45028* (2013.01); *G05B 2219/50218* (2013.01); *H01J 2237/20228* (2013.01)

(56) References Cited

U.S. PATENT DOCUMENTS

| | | | |
|---|---|---|---|
| 7,289,858 B2* | 10/2007 | Van Donkelaar | G05B 21/02 700/45 |
| 2003/0097193 A1* | 5/2003 | Makino | G05B 5/01 700/42 |
| 2005/0267609 A1* | 12/2005 | Van Donkelaar | G05B 21/02 700/45 |
| 2007/0035266 A1* | 2/2007 | Sako | G05B 19/19 318/561 |
| 2013/0106319 A1* | 5/2013 | Moriya | B60N 2/0244 318/128 |

\* cited by examiner

DRIVING APPARATUS, LITHOGRAPHY APPARATUS, AND METHOD OF MANUFACTURING AN ARTICLE

BACKGROUND OF THE INVENTION

Field of the Invention

The present invention relates to a driving apparatus, a lithography apparatus, and a method of manufacturing an article.

Description of the Related Art

Robots, transportation machines, and industrial machines and the like that have movable parts driven under controlled conditions regarding its position are known. When a positioning mechanism of such a driving apparatus breaks down, the driving apparatus has to be stopped long time for recovery efforts such as specification of the failure location and repair/replacement of parts, and the throughput will decrease. Also, the performance may be maintained and managed by providing a mechanism such as a sensor for self-monitoring or self-diagnosis or the like in each unit of a driving apparatus to shorten the down time of the driving apparatus required for recovery efforts. However, parts only for self-diagnosis are redundant for an apparatus and cause cost increase. Therefore, Japanese Patent No. 4272750 discloses an apparatus in which temporal changes in dynamic characteristics of a driving mechanism are identified, and self-diagnosis for maintaining performance is performed. Also, Japanese Patent Laid-Open No. 2003-284388 discloses an apparatus comprising a movable part having a plurality of actuators, wherein a thrust balance of respective actuators is monitored, and an abnormality determination is performed.

However, the apparatus disclosed in Japan Patent No. 4272750 just focuses attention on changes in input-output characteristics of the whole apparatus, and cannot specify a cause of an internal failure of the apparatus. In addition, when identifying dynamic characteristics, although higher-order modeling is needed to improve an accuracy of identification, high-order components are affected by machine differences or noises or the like, and thus, it is not possible to obtain data with high accuracy. Also, the apparatus disclosed in Japanese Patent Lain-Open No. 2003-284388 just detects whether or not abnormality exists in a driving mechanism, and cannot perform specification of failure spots and quantitative acquisition of failure states.

SUMMARY OF THE INVENTION

The present invention provides, for example, a driving apparatus advantageous in terms of self-diagnosis thereof.

A driving apparatus according to the present invention comprises a movable part; a measuring device configured to measure a position of the movable part; two actuators configured to respectively generate two thrusts which have a common axis of action thereof with respect to the movable part; and a controller configured to control the position by the two actuators based on an output of the measuring device, wherein the controller is configured to obtain information of at least one of a thrust constant of one of the two actuators, a thrust constant of the other of the two actuators, and rigidity of a member which supports the movable part with respect to the axis of action, based on a relationship between a disturbance force estimated based on thrust commands for the two actuators and an output of the measuring device in a case where one of the two actuators is caused to generate a thrust and the other of the two actuators is caused to control the position, and a thrust command for the one of the two actuators.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings.

Figure 1:
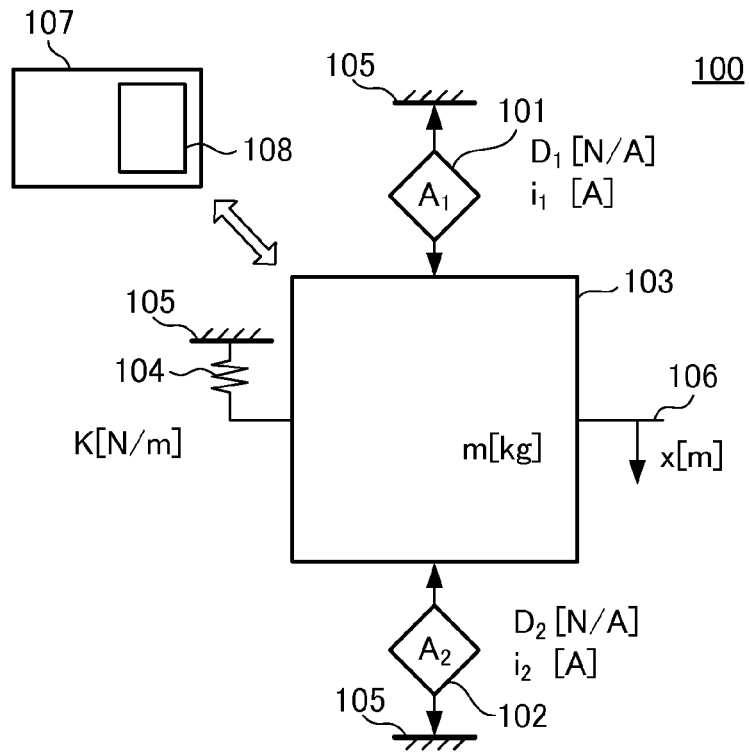
FIG. 1 is a diagram illustrating a configuration of a driving apparatus according to an embodiment of the present invention.

Firstly, a description will be given of a configuration of a driving apparatus according to the present invention. FIG. 1 is a schematic diagram illustrating a configuration of a driving apparatus 100 according to an embodiment of the present invention. The driving apparatus 100 is an apparatus which drives a movable part by means of a plurality of actuators in various implements such as robots, transportation machines, industrial machines, or the like. The driving apparatus 100 comprises a movable part 103, two actuators 101 and 102, an elastic body 104, and a position sensor 106 within the same degree of freedom.

The movable part 103 is a member that is supported by a supporting structure 105 and the position thereof can move under controlled conditions. The two actuators 101 and 102 are driving mechanisms that are located between the movable part 103 and the supporting structure 105 with a common axis of action, respectively generating two thrusts that drive the movable part 103 in response to an applied electric current. In this manner, by separately arranging the two actuators 101 and 102 for the one movable part 103, thermal damage in the vicinity of the actuators caused by the heat of actuators can be reduced, and deformation of the movable part 103 and the supporting structure 105 can be suppressed by the dispersion of stress. Although the present invention employs a configuration in which two actuators are arranged for a movable part, the present invention is not limited to such configuration, and three or more actuators can be arranged as long as they have an axis of action in the same direction as the movable direction of the movable part 103. The elastic body 104 is, for example a coil spring, located between the movable part 103 and the supporting structure 105, suppressing vibrations of the movable part 103 or the like and supporting the same. In FIG. 1, the elastic body 104 is the sum of elastic components in the direction having the same degree of freedom as the movable direction of the movable part 103. Although the present invention employs a configuration that comprises one elastic body 104 for one movable part 103, the present invention is not limited to such configuration, and allows a configuration which comprises a plurality of elastic bodies 104. The position sensor 106 is a measuring device which measures a relative position of the movable part 103 and the supporting structure 105. The relative position measured by the position sensor 106 (output of the position sensor 106) is sent to the controller 107 as position information, and the controller 107 drives the actuators 101 and 102 based on the position information and controls a position of the movable part 103.

The controller 107 is configured by an electric circuit or a software or the like, for example, and is capable of controlling operations, adjustments and the like of each unit of the driving apparatus 100. The controller 107 comprises a disturbance observer 108 and a memory device not shown, being connected to each unit of the driving apparatus 100 via lines, being capable of executing the control of each unit according to programs or the like. The controller 107 of the present invention executes at least position control, including an estimated disturbance calculation processing, and a self-diagnosis processing (failure diagnosis processing or fault diagnosis processing) using disturbance observer 108. The disturbance observer 108 is a mechanism which is incorporated in a position control system of the controller 107 and intended to improve control performance, and calculates a disturbance force (estimated disturbance $d_o$) that the movable part 103 is expected to receive based on parameters and input-output characteristics of each unit. The controller 107 compares the estimated disturbance $d_o$ calculated by the disturbance observer 108 with a predetermined threshold value (reference value) stored in the memory device. The controller 107 can be integrally configured with other parts of the driving apparatus 100 (in a common housing), and also it can be configured separately from other parts of the driving apparatus 100 (in a separate housing).

Figure 2:
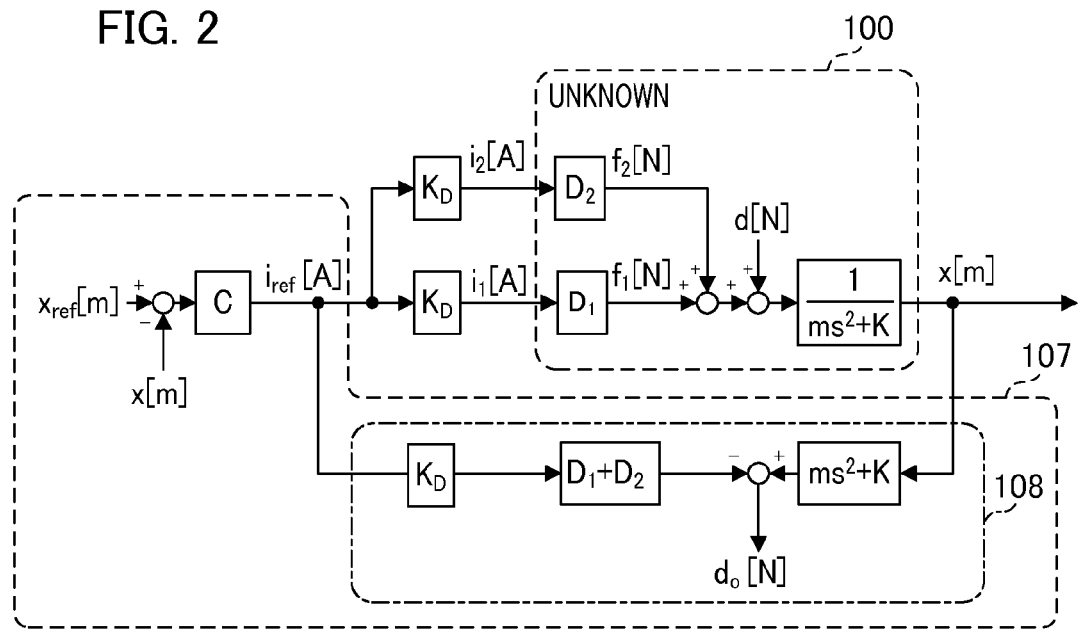
FIG. 2 is a functional block diagram of an estimated disturbance calculation processing of the driving apparatus.

Next, a description will be given of the estimated disturbance calculation processing of the driving apparatus according to the present embodiment. In the present specification, the estimated disturbance calculation processing is a processing in the position control of the movable part 103, in which a disturbance force occurred in the movable part 103 is estimated, and a change in parameters of the apparatus is monitored by continuously monitoring the estimated disturbance $d_o$. FIG. 2 is a functional block diagram of the estimated disturbance calculation processing. Firstly, the controller 107 calculates a thrust command $i_{ref}$ for the actuators 101 and 102 based on a difference between a target position $x_{ref}$ of the movable part 103 and a position signal x of the movable part 103 obtained by the position sensor 106, and the operations of a compensator C. The thrust command $i_{ref}$ is a value of a thrust command indicating thrusts that the actuators 101 and 102 should output, and is converted to electric currents $i_1$ and $i_2$ to be applied to the actuators 101 and 102 respectively via drive circuits $K_D$. The actuators 101 and 102 respectively convert the electric currents $i_1$ and $i_2$ to thrusts $f_1$ and $f_2$ of the actuators using thrust constants $D_1$ and $D_2$ included in the actuators 101 and 102. In this way, the movable part 103 is driven by the resultant force of the thrusts $f_1$ and $f_2$ occurring in the actuators 101 and 102. Here, a disturbance force d, caused by, for example, a force transmitted to the movable part 103 by vibration of the supporting structure 105 via electric cables or the elastic body 104, is also applied to the movable part 103 in addition to controlling forces by the actuators. When the disturbance force d, in addition to the thrusts of the actuators 101 and 102, is applied to the movable part 103, the accuracy of position control of the movable part 103 may decrease.

Therefore, a method in which a disturbance observer is incorporated into a position control system to improve control performance has been known in the position control of a movable part 103. The block of the disturbance observer 108 shown in FIG. 2 represents an operation portion that estimates the disturbance force applied to the movable part 103. The estimated disturbance $d_o$ can be calculated using the following formula 1.

[Formula 1]

$$d_o = \ddot{x}m + xK - i_{ref}K_D \cdot D_1 - i_{ref}K_D \cdot D_2 \tag{1}$$

In the formula, the first term and the second term on the right-hand side represent a mathematized control object, and the third term and the fourth term on the right-hand side represent controlling forces.

In an actual apparatus, components included in the estimated disturbance $d_o$ can be classified generally into three types. The first component is the disturbance force d applied to the movable part 103 as described above. The second component is a difference between parameters used in the formula 1 and actual parameters. The amount of change in parameters of units in the apparatus is also a part of the estimated disturbance $d_o$. The third component includes non-modeled components not included in the formula 1. In an actual apparatus, the disturbance force d is complexly configured by the electric dynamic characteristics of a sensor response and a driver response, the higher order mode of a structure, the nonlinear components such as viscosity and friction, and the like in addition to the mathematized components in the formula 1. These non-modeled components not included in the formula 1 are also calculated as a part of the estimated disturbance $d_o$.

By focusing only on the static characteristics of the estimated disturbance $d_o$, the formula 1 can be converted to the following formula 2.

[Formula 2]

$$d_o = xK - i_{ref}K_D \cdot (D_1 + D_2) \tag{2}$$

By focusing attention on the static characteristics, the terms of the dynamic characteristics can be deleted, and in fact, the third component included in the estimated disturbance $d_o$ becomes reduced, thus the accuracy in calculation of the estimated disturbance $d_o$ can be improved without taking the third component into consideration. In formula 2, when thinking about cases where the disturbance force d as the first component is small or the disturbance force d is known, it will be understood that the estimated disturbance $d_o$ is calculated using the amount of change in parameters of units in the apparatus that corresponds to the second component, as a principal component. As described above, the amount of change in parameters of units in the apparatus can be extracted from the variation of the estimated disturbance $d_o$.

In the driving apparatus 100, the movable part 103 is driven under controlled conditions regarding its position x by the actuators 101 and 102, and the estimated disturbance $d_o$ is continuously monitored using the disturbance observer 108. If the amount of change in the estimated disturbance $d_o$ exceeds a predetermined threshold (a reference), it is determined that certain failures have occurred. However, at this point, only the occurrence of a change in any of parameters is detected, and it is not possible to specify which unit in the apparatus has been changed in its parameter. Therefore, when the amount of change in the estimated disturbance $d_o$ exceeds the predetermined threshold, a process for failure diagnosis is started. Details of the failure diagnosing processing is described below.

Figure 3:
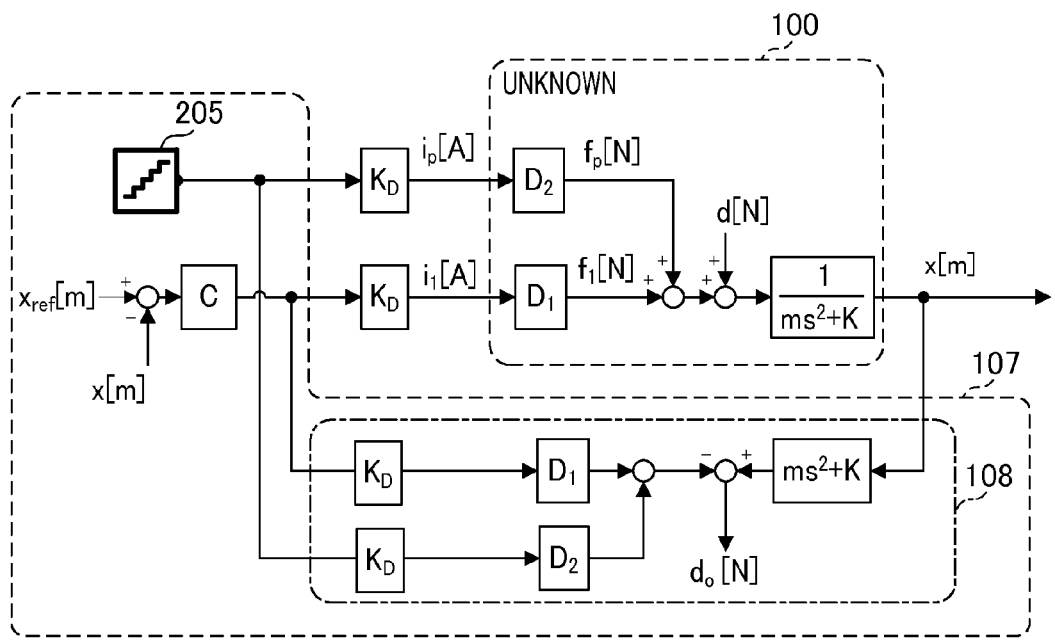
FIG. 3 is a functional block diagram of a failure diagnosing processing of the driving apparatus.

Here, a description will be given of such failure diagnosing processing. In the present specification, the failure diagnosing processing is a processing in which the unit acting on change in the estimated disturbance $d_o$ is specified from units in the apparatus. FIG. 3 is the control block diagram of the failure diagnosing processing. In FIG. 3, the same components as FIG. 2 are denoted by the same reference number, and explanations thereof are omitted. As described above, in the estimated disturbance calculation processing, when the value of the estimated disturbance $d_o$ exceeds the predetermined threshold, the controller 107 shifts the position control of the driving apparatus 100 to the failure diagnosing processing. As shown in FIG. 3, in the failure diagnosing processing, a position control system by the two actuators 101 and 102 is stopped, and the position of the movable part 103 is controlled using only the actuator 101. A diagnostic signal 205 for diagnosing a failure is input into the actuator 102 in a state in which the position of the movable part 103 is controlled by the actuator 101. The diagnostic signal 205 is converted to a diagnostic current $i_p$ by the drive circuit $K_D$.

Figure 4:
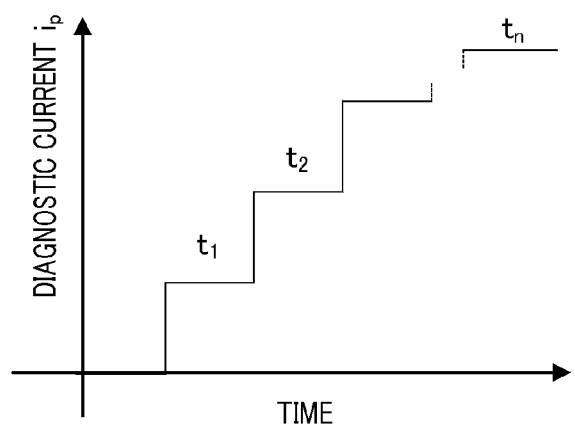
FIG. 4 is a graph illustrating an example of diagnostic signal pattern of the driving apparatus.

Here, the diagnostic signal 205 used in the failure diagnosing processing is a signal comprising a static signal and having at least two or more different operating points. In the present invention, a signal that generates a diagnostic current $i_p$ changing stepwise in time as shown in FIG. 4 is used as the diagnostic signal 205 by way of example. However, the present invention is not limited to this configuration, and can apply a signal comprising a static signal and having at least two or more different operating points.

In the failure diagnosing processing shown in FIG. 3, the estimated disturbance $d_o$ focusing only on static characteristics can be calculated using the following formula 3.

[Formula 3]

$$d_o \propto K - i_1 D_1 - i_p D_2 \quad (3)$$

K: supporting rigidity of the elastic body 104 [N/m]
$D_1$: thrust constant of the actuator 101 [N/A]
$D_2$: thrust constant of the actuator 102 [N/A]
$d_o$: estimated disturbance [N]
$i_1$: current flowing in the actuator 101 [A]
$i_p$: diagnostic current flowing in the actuator 102 [A]

Here, the first term on the right-hand side of the formula 3 represents a force applied to the system, and the second term and the third term on the right-hand side represent thrusts that the actuators 101 and 102 apply to the movable part 103. By calculating the difference between the first term and the second and third terms, the disturbance force can be estimated.

Furthermore, in the formula 3, the first term on the right-hand side of the formula 3 corresponds to the second term on the right-hand side and the estimated disturbance $d_o$ becomes zero when it is presumed that the disturbance force d, the amount of change in parameters, and the diagnostic current $i_p$ are zero, and the position of the movable part 103 is not changed by the actuator 101.

Next, the estimated disturbance d, in cases where a constant diagnostic current $i_p$ is applied can be represented by the following formula 4.

[Formula 4]

$$d_o = xK - i_{1\_const} D_1 + i_{1\_p} D_1 - i_p D_2 \quad (4)$$

Here, the fourth term on the right-hand side of the formula 4 represents a thrust generated from the actuator 102 by the diagnostic current $i_p$, and the second term represents a controlling current for the position of the movable part 103 generated from the actuator 101. The third term represents a current for offsetting the thrust of the actuator 102. In the formula, $i_{1\_const}$ means a current value applied to the actuator 101 when the diagnostic current $i_p$ is zero. Here, the position x of the movable part remains unchanged on the assumption that the position of the movable part 103 is kept constant by the actuator 101. Therefore, it will be understood that the first and second terms on the right-hand side of the formula 4 are fixed values.

Thus, the formula 4 can be divided into components that change depending on the diagnostic current $i_p$ and components fixed regardless of the diagnostic current $i_p$, and the formula 4 can be replaced by a linear expression like the following formula 5.

[Formula 5]

$$d_o = F(D_1, D_2) i_p + C(K, D_1) \quad (5)$$

The components depending on the diagnostic current $i_p$ correspond to the slope F having parameters of the thrust constants $D_1$ and $D_2$ as a first order coefficient, and the components having fixed values correspond to an intercept C having parameters of the supporting rigidity (rigidity) K and the thrust constant $D_1$ as a zero order coefficient. The present invention independently detects parameter change in the supporting rigidity K and the thrust constants $D_1$ and $D_2$, and obtains information about parameter change of units in the driving apparatus 100 based on the formula 5.

Figure 5A:
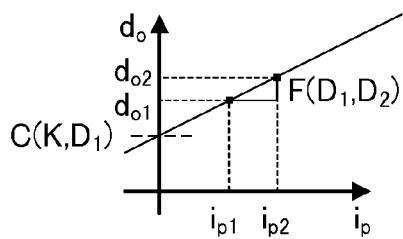
FIGS. 5A to 5D are graphs illustrating disturbance observer output characteristics of the driving apparatus.

Next, a description will be given of a detection method for parameter change based on the formula 5. Firstly, a constant diagnostic current $i_{p1}$ is applied to the actuator 102, and an estimated disturbance $d_{o1}$ at that point is recorded. Next, a diagnostic current $i_{p2}$ differing from the diagnostic current $i_{p1}$ is applied to the actuator 102, and in turn an estimated disturbance $d_{o2}$ is recorded. Linear characteristics of the diagnostic current $i_p$ and the estimated disturbance $d_o$ are obtained by performing a linear approximation using the diagnostic currents $i_{p1}$ and $i_{p2}$ and the estimated disturbances $d_{o1}$ and $d_{o2}$. FIG. 5A is a graph illustrating linear characteristics of the diagnostic current $i_p$ and the estimated disturbance $d_o$ as an example of output characteristics of the disturbance observer 108. A change in any of the supporting rigidities K of the elastic body 104 and the thrust constants $D_1$ and $D_2$ of the respective actuators 101 and 102 can be read from a change in the slope F or the intercept C in the formula 5.

Figure 5B:
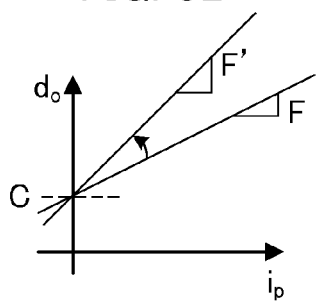

For example, in cases where the slope F has changed to a slope F' and the intercept C remains unchanged as shown in FIG. 5B, it is understood that the thrust constant $D_2$ of the actuator 102 has been changed. The intercept C remaining unchanged shows that the supporting rigidity K and the thrust constant $D_1$ have not been changed, and the change in the slope F can be interpreted to mean that it has been caused by a change in the thrust constant $D_2$ of the actuator 102. In this case, the amount of change in $D_2$ is equal to the amount of change in F, and it can be calculated by F−F'.

Figure 5C:
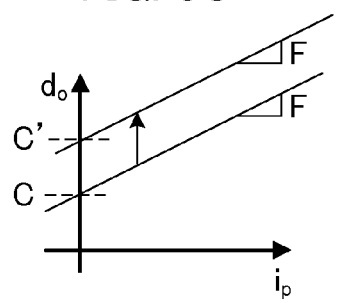

As shown in FIG. 5C, in cases where the slope F remains unchanged and only the intercept C has changed, it is understood that the supporting rigidity K has been changed. The slope F remaining unchanged shows that the thrust constants $D_1$ and $D_2$ have not been changed, and the change in the intercept C can be interpreted to mean that it has been caused by change in the supporting rigidity K. In this case, the amount of change in the supporting rigidity K is equal to the quotient of the amount of change in the intercept C divided by the position x of the movable part 103, and it can be calculated by (C−C')/x. Here, the failure diagnosis must be performed with the movable part 103 being located on the position x, excluding the zero position. Also, it is desired that the failure diagnosis be performed with the position x, which has as large absolute value as possible and in which the supporting rigidity K becomes high as much as possible, to improve the accuracy of calculation of the amount of change in parameters. In addition, the position x used when determining the amount of change in the supporting rigidity K is a relative position referring to the position in which the supporting rigidity K becomes zero. Therefore, the position in which the supporting rigidity K becomes zero must be calculated in advance. For this purpose, the output of a measurement result by the position sensor 106 in a state in which outputs of the actuators are shut off and the position x of the movable part 103 is being stabilized may be recorded in advance.

Figure 5D:
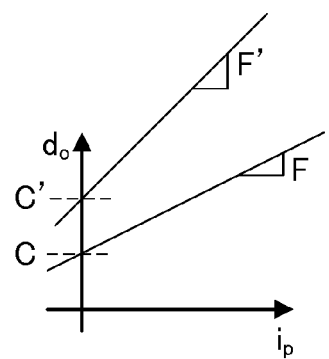

Furthermore, as shown in FIG. 5D, in cases where both the slope F and the intercept C have changed, it is understood that the thrust constant $D_1$ of the actuator 101 has been changed. Because the thrust constant $D_1$ is the only parameter which is common to the slope F and the intercept C, it is possible to determine that change in the thrust constant $D_1$ has occurred. The amount of change in the thrust constant $D_1$ can be calculated by either F−F' or (C−C')/$i_{1\_const}$. However, regarding cases where both the slope F and the intercept C have changed, the same result can occur when, other than a change only in the thrust constant $D_1$, multiple parameters have change concurrently, such as a combination of the thrust constant $D_2$ and the supporting rigidity K, and these are indistinguishable from each other. In this case, it is possible to determine whether change has occurred only in the thrust constant $D_1$ or in other parameters of multiple units by exchanging the actuator assigned to the position control for the actuator inputting the diagnostic signal 205.

In the present specification, the driving apparatus 100 calculates the amount of parameter change, and it is therefore necessary to record in advance the estimated disturbance $d_o$, the slope F and the intercept C in a normal state to the memory device as a reference to compare with the normal time. Here, when a reference value is obtained in a certain position x, the failure diagnosing processing has to be performed in the same position x as the position where the reference value has been obtained because the supporting rigidity K is a coefficient depending on the position x. Also, a reference value may be a table with respect to the position x of the movable part.

In the present specification, the driving apparatus 100 is configured to obtain the estimated disturbance $d_o$ in relation to two points of the diagnostic current $i_{p1}$ and $i_{p2}$. However, the present invention is not limited to such configuration, and a configuration in which values of the diagnostic current $i_p$ and the disturbance observer output $d_o$ in relation to respective zero order intervals $t_1$-$t_n$ shown in FIG. 4 are obtained is also possible. The obtained values undergo a filter processing such as averaging arithmetic, and then, as described above, a linear approximation is performed in relation to the diagnostic current $i_p$ and the thrust constant $d_o$, and the slope F and the intercept C are calculated. Thus, it is desired in terms of the accuracy that the number n of the obtained values is large. However, because the time required for failure diagnosis increases depending on the number of values, it is possible to set an optimum value in the apparatus in consideration of both points of view. Here, the data from the zero order intervals $t_1$-$t_n$ are desirably obtained at a timing excluding just after the diagnostic signal 205 ascended a step to obtain the data from a region in which the dynamic characteristics of the apparatus can be sufficiently ignored.

In the driving apparatus 100, one of the two actuators 101 and 102 generates the thrust, while the other of the two actuators 101 and 102 controls the position. In this state, the estimated disturbance $d_o$ to the movable part 103 is calculated based on the thrust command $i_{ref}$ for the two actuators 101 and 102, and the output of the position sensor 106. It is possible to obtain information (amount of change) of at least one of the thrust constant of the one actuator, the thrust constant of the other actuator, and the rigidity K of the elastic body 104 which supports the movable part 103 with respect to the axis of action, based on the relationship between the calculated estimated disturbance $d_o$ and the thrust command $i_{ref}$ for the one actuator. The driving apparatus 100 of the present invention can specify the unit in the apparatus in which the value of the thrust constant or the supporting rigidity has changed by aging deterioration, that is, a failure has occurred, based on the information. Also, in cases of the occurrence of failures in a plurality of locations, generally a failure in a single location occurs first, which expands to secondary damage in a plurality of locations secondarily. The driving apparatus 100 of the present invention can detect signs of failure in units of the apparatus, and suppress the expansion of damage in a plurality of locations in the apparatus by the above configuration.

Also, the driving apparatus 100 of the present invention calculates changes in parameters based on the static characteristics. By focusing attention on the static characteristics, it is possible to reduce the influence of dynamic parameters such as inertia, viscosity, in addition to influences due to structural rigidity and electric dynamic characteristics, and determine changes in the thrust constants $D_1$ and $D_2$ of the actuators 101 and 102 and the supporting rigidity K of the elastic body 104. Furthermore, in the driving apparatus 100 of the present invention, high-speed sampling is not required for obtaining data because a static state is observed, and improvement of the accuracy of obtained data can be achieved by a filter processing such as averaging arithmetic.

Figure 6:
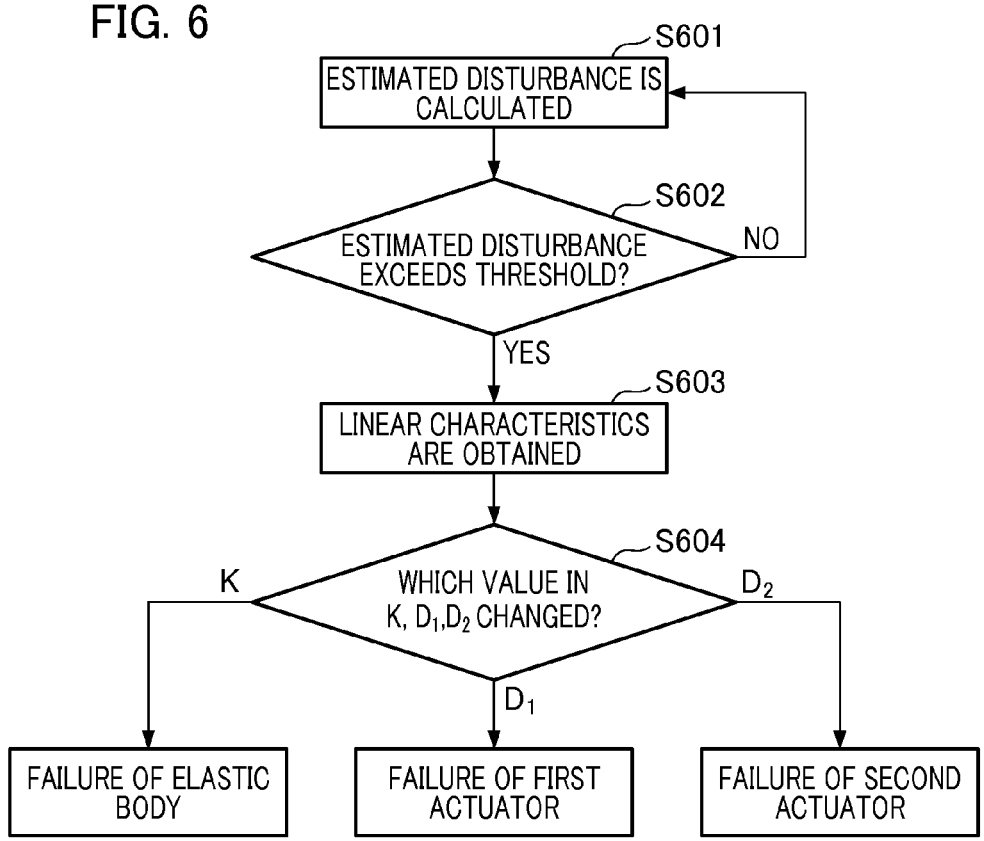
FIG. 6 is a flow chart illustrating a flow of position control of the driving apparatus.

Based on the above, a description will be given of a entire flow of the position control performed by the controller 107 of the driving apparatus 100. FIG. 6 is a flow chart from the estimated disturbance calculation processing to the failure diagnosing processing of the driving apparatus 100. Firstly, the position of the movable part 103 is controlled by the actuators 101 and 102, while the controller 107 performs the above described estimated disturbance calculation processing using the disturbance observer 108, and calculates the estimated disturbance $d_o$ (Step S601). The controller 107 compares the calculated estimated disturbance $d_o$ with the predetermined threshold previously stored in the memory device, and determines that the value of the estimated disturbance $d_o$ does not exceed the threshold (Step S602). If the value of the estimated disturbance $d_o$ does not exceed the threshold (NO), the processing returns to the estimated disturbance calculation processing. If the estimated disturbance $d_o$ exceeds the threshold (YES), it is determined that a failure has occurred in some among the units in the apparatus, and the failure diagnosing processing is started to perform more detailed failure diagnosis. According to the functional block of the failure diagnosing processing described above, the slope F and the intercept C is calculated using the formula 5 derived based on a sequentially provided plurality of the diagnostic signals, each of which has a different value as static commands, and the linear characteristics are obtained (Step S603). The slope F (first order coefficient) and the intercept C (zero order coefficient) obtained are compared with the reference values stored in the memory device, and among the rigidity K of the elastic body 104 and the thrust constants $D_1$ and $D_2$ of the actuators 101 and 102, the changed parameter is determined based on a difference obtained by the comparison (Step S604).

Because the driving apparatus 100 can obtain information about a changed parameter, it is possible to specify a failure in units in the apparatus and to perform a self-diagnosis for the failure location using the information.

Next, a description will be given of a specific example of control using such diagnostic result. When a changed parameter has been specified by the failure diagnosing processing, an optimal countermeasures will be carried out depending on the failure location. For example, when the thrust constant $D_1$ of the actuator 101 has decreased, position loop characteristics can be kept constant by increasing the thrust command $i_{ref}$ of the actuator 101 depending on the amount of the change using the compensator C (changing characteristics of the compensator C). Also, when the thrust constant $D_2$ of the actuator 102 has changed, the position loop characteristics can be kept constant by modifying the thrust command $i_{ref}$ of the actuator 102 depending on the amount of the change using the compensator C. In addition, in cases where the amount of change in each parameter increases such that unit specifications cannot be kept, the life of the apparatus can be prolonged by limiting the drive range of the movable part 103 or the use range of the voltage or the current of the actuators 101 and 102 or the like.

The driving apparatus 100 is configured to start the failure diagnosing processing when the estimated disturbance $d_o$ exceeds the threshold in the normal estimated disturbance calculation processing. However, the present invention is not limited to such configuration, and can be configured to perform the failure diagnosing processing periodically. In this case, it is preferable to incorporate the failure diagnosing processing into an equipment sequence to reduce an effect on the throughput of the equipment into which the driving apparatus is incorporated. A trend of change in each parameter can be obtained by performing the failure diagnosis periodically. For example, the period in which the apparatus reaches an unacceptable amount of change can be predicted by a trend of change in parameter and a future value prediction using a first order approximation thereof. Also, if a failure time can be predicted, a planned countermeasures in accordance with an apparatus operation will be possible in the event that maintenance or repair are needed due to a failure. A configuration in which the predicted failure time is indicated to users of the apparatus as a warning message or the like, and the countermeasures at the time of the parameter change described above is performed in the predicted failure time is also possible.

(Application Example)

The driving apparatus described above is useful for robots, transportation machine or equipment, industrial machine or equipment (including machines for machining, processing, measuring, and manufacturing), or the like. Here, an application example for a lithography apparatus as an industrial machine will be described by way of illustration. A lithography apparatus is an apparatus performing patterning on a substrate, which can be realized as, for example, an exposure apparatus, a drawing apparatus, or an imprint apparatus. An exposure apparatus, for example, forms a (latent image) pattern on (a resist on) a substrate using (extreme) ultraviolet light. Also, a drawing apparatus, for example, forms a (latent image) pattern on (a resist on) a substrate using a charged particle beam (electron beam or the like). Also, an imprint apparatus molds an imprint material on a substrate and forms a pattern on a substrate.

Figure 7:
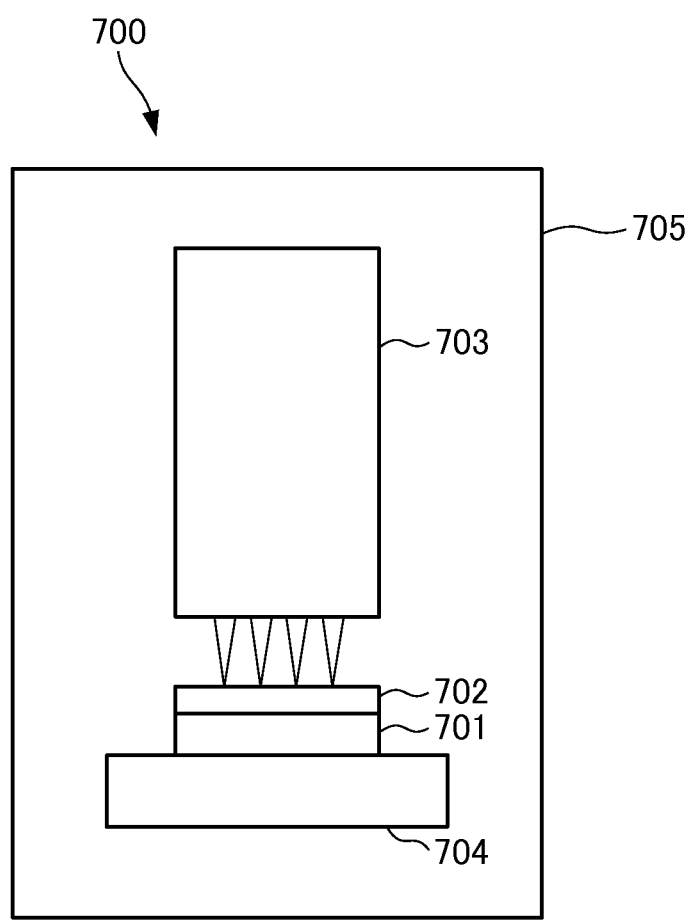
FIG. 7 is a diagram illustrating a configuration of a lithography apparatus that can apply the driving apparatus of the present invention.

FIG. 7 is a diagram illustrating a configuration of a lithography apparatus according to the present embodiment. Here, a drawing apparatus using an electron beam will be described as an example of a lithography apparatus. An ion beam or other charged particle beam can be used instead of an electron beam. A lithography apparatus 700 comprises a vacuum chamber 705, an electronic optical system 703 housed in the vacuum chamber 705, and a driving apparatus 704, performing drawing on a substrate 702 using an electron beam in vacuum. Reference numeral 701 is a stage (a holding member) holding the substrate 702. The driving apparatus 704 is configured to move the holding member 701 to position the substrate 702 with respect to the electronic optical system 703. The driving apparatus 704 can be the driving apparatus described in the previous embodiments.

(Article Manufacturing Method)

An article manufacturing method according to an embodiment of the present invention is preferred in manufacturing an article such as a micro device, for example, a semiconductor device or the like, an element or the like having a microstructure, or the like. The article manufacturing method may include a step of forming a pattern (e.g., latent image pattern) on an object (e.g., a substrate on which a photosensitive material is coated) using the aforementioned lithography apparatus; and a step of processing (e.g., a step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-083454 filed Apr. 15, 2014, which is hereby incorporated by reference herein in its entirety.

What is claimed is:

1. A driving apparatus comprising:
a movable part;
a measuring device configured to measure a position of the movable part;
two actuators configured to respectively generate two thrusts having a substantially common axis of action thereof with respect to the movable part; and
a controller configured to:
control the position by the two actuators based on measured position of the movable part; and
obtain information of a thrust constant of one of the two actuators, a thrust constant of the other of the two actuators, or rigidity of a member supporting the movable part with respect to the axis of action, or any combination thereof, based on a relationship between a disturbance force estimated based on thrust commands for the two actuators and measured position of the movable part in a case where one of the two actuators is caused to generate a thrust and the other of the two actuators is caused to control the position, and a thrust command for the one of the two actuators.

2. The apparatus according to claim 1, wherein the controller is further configured to obtain, as the information, an amount of change in the thrust constant of the one of the two actuators, an amount of change in the thrust constant of the other of the two actuators, or an amount of change in the rigidity, or any combination thereof, based on a difference between a first-order coefficient of a linear expression, which represents the disturbance force and is linear with respect to the thrust command for the one of the two actuators, and a reference value thereof, and a difference between a zero-order coefficient of the linear expression and a reference value thereof.

3. The apparatus according to claim 2, wherein the controller is configured to obtain the amount of change in the thrust constant of the one of the two actuators based on the difference between the first-order coefficient and the reference value thereof.

4. The apparatus according to claim 2, wherein the controller is configured to obtain the amount of change in the rigidity based on the difference between the zero-order coefficient and the reference value thereof.

5. The apparatus according to claim 1, wherein the controller includes a compensator configured to generate one of the thrust commands, and is configured to change a characteristic of the compensator based on the information.

6. The apparatus according to claim 1, wherein the controller is configured to perform an output of the information.

7. The apparatus according to claim 1, wherein the controller is configured to sequentially provide a plurality of static commands, values of which are different from each other, to cause the one of the two actuators to generate the thrust.

8. The apparatus according to claim 1, wherein the controller is configured to obtain information of the thrust constant of the one of the two actuators, the thrust constant of the other of the two actuators, or the rigidity, or any combination thereof, further based on a relationship between a disturbance force estimated based on thrust commands for the two actuators and an output of the measuring device in a case where the other of the two actuators is caused to generate a thrust and the one of the two actuators is caused to control the position, and a thrust command for the other of the two actuators.

9. A lithography apparatus configured to perform patterning of a substrate, the lithography apparatus comprising:
one of an exposure apparatus, a drawing apparatus, or an imprint apparatus; and
a driving apparatus comprising:
a movable part;
a measuring device configured to measure a position of the movable part;
two actuators configured to respectively generate two thrusts having a substantially common axis of action thereof with respect to the movable part; and
a controller configured to:
control the position by the two actuators based on the measured position of the movable part; and
obtain information of a thrust constant of one of the two actuators, a thrust constant of the other of the two actuators, or rigidity of a member supporting the movable part with respect to the axis of action, or any combination thereof, based on a relationship between a disturbance force estimated based on thrust commands for the two actuators and the measured position of the movable part in a case where one of the two actuators is caused to generate a thrust and the other of the two actuators is caused to control the position, and a thrust command for the one of the two actuators.

10. The lithography apparatus according to claim 9, wherein the movable part comprises a holder configured to hold the substrate.

11. The lithography apparatus according to claim 9, wherein the apparatus is configured to perform the patterning with light, a charged particle, or a mold, or any combination thereof.

12. A method of manufacturing an article, the method comprising steps of:
performing patterning of a substrate using a lithography apparatus; and
processing the substrate with the patterning to manufacture the article,
wherein the lithography apparatus is configured to perform patterning of the substrate, and includes a driving apparatus, and
wherein the driving apparatus includes:
a movable part;
a measuring device configured to measure a position of the movable part;
two actuators configured to respectively generate two thrusts having a substantially common axis of action thereof with respect to the movable part; and
a controller configured to:
control the position by the two actuators based on the measured position of the movable part; and
obtain information of a thrust constant of one of the two actuators, a thrust constant of the other of the two actuators, or rigidity of a member supporting the movable part with respect to the axis of action, or any combination thereof, based on a relationship between a disturbance force estimated based on thrust commands for the two actuators and the measured position of the movable part in a case where one of the two actuators is caused to generate a thrust and the other of the two actuators is caused to control the position, and a thrust command for the one of the two actuators.

* * * * *